(12) United States Patent
Zhang (10) Patent No.: US 10,551,951 B2
(45) Date of Patent: Feb. 4, 2020

(54) INPUT ASSEMBLY WITH FINGERPRINT IDENTIFICATION CHIP ARRANGED BETWEEN A TOUCH PANEL AND FLEXIBLE CIRCUIT BOARD

(71) Applicant: GUANGDONG OPPO MOBILE TELECOMMUNICATIONS CORP., LTD., Dongguan, Guangdong (CN)

(72) Inventor: Wenzhen Zhang, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 15/674,905

(22) Filed: Aug. 11, 2017

(65) Prior Publication Data

US 2018/0052554 A1 Feb. 22, 2018

(30) Foreign Application Priority Data

Aug. 16, 2016 (CN) .......................... 2016 1 0678008
Aug. 16, 2016 (CN) ...................... 2016 2 0891031 U (51) Int. Cl.
| | | |
|---|---|---|
| *G06F 3/041* | (2006.01) | |
| *G06K 9/00* | (2006.01) | |
| *H04M 1/02* | (2006.01) | |
| *H05K 1/11* | (2006.01) | |

(52) U.S. Cl.
CPC ......... *G06F 3/0412* (2013.01); *G06K 9/0002* (2013.01); *G06K 9/00087* (2013.01); *H04M 1/0277* (2013.01); *H05K 1/118* (2013.01); *G06F 2203/04102* (2013.01); *G06F 2203/04103* (2013.01); *H04M 1/0266* (2013.01); *H04M 2250/22* (2013.01)

(58) Field of Classification Search
CPC ......... G06F 3/0412; G06F 2203/04103; G06F 2203/04102; G06F 3/041–044; H04M 1/26; H04M 1/0277; H04M 1/0266; H04M 2250/22; G06K 9/0002; G06K 9/00087; H05K 1/118
See application file for complete search history.

(56) References Cited

U.S. PATENT DOCUMENTS

| | | |
|---|---|---|
| 7,339,204 B2 | 3/2008 | Thomas |
| 2002/0016024 A1 | 2/2002 | Thomas |
| 2003/0091220 A1 | 5/2003 | Sato et al. |

(Continued)

FOREIGN PATENT DOCUMENTS

| | | |
|---|---|---|
| CN | 103425965 A | 12/2013 |
| CN | 104134063 A | 11/2014 |

(Continued)

*Primary Examiner* — Temesghen Ghebretinsae
*Assistant Examiner* — Ivelisse Martinez Quiles
(74) *Attorney, Agent, or Firm* — Young Basile Hanlon & MacFarlane, P.C.

(57) ABSTRACT

An input assembly includes a touch panel, a fingerprint identification chip, and a flexible circuit board. The fingerprint identification chip is attached to a lower surface of the touch panel. The flexible circuit board is attached to the fingerprint identification chip. The touch panel and the flexible circuit board are correspondingly disposed on two opposite sides of the fingerprint identification chip.

6 Claims, 5 Drawing Sheets

(56) References Cited

U.S. PATENT DOCUMENTS

| | | | |
|---|---|---|---|
| 2014/0140588 A1* | 5/2014 | Chou | G06K 9/0002 |
| | | | 382/124 |
| 2014/0216914 A1 | 8/2014 | Pope et al. | |
| 2014/0352440 A1* | 12/2014 | Fennell | G01N 29/22 |
| | | | 73/632 |
| 2015/0036065 A1* | 2/2015 | Yousefpor | G06K 9/228 |
| | | | 349/12 |
| 2015/0371076 A1* | 12/2015 | Lee | G06F 3/041 |
| | | | 382/124 |
| 2016/0004899 A1* | 1/2016 | Pi | G06F 1/1626 |
| | | | 345/173 |
| 2016/0171271 A1* | 6/2016 | Lundahl | G06F 3/044 |
| | | | 382/124 |
| 2016/0357294 A1* | 12/2016 | Ozeki | C03C 15/00 |
| 2016/0364036 A1* | 12/2016 | Deng | G06K 9/00013 |
| 2017/0004343 A1* | 1/2017 | Xie | G06F 3/0416 |
| 2017/0109565 A1 | 4/2017 | Pope et al. | |
| 2017/0124370 A1* | 5/2017 | He | G06K 9/0012 |
| 2017/0285746 A1* | 10/2017 | Kim | G06F 3/044 |
| 2017/0371461 A1* | 12/2017 | Lee | G06K 9/00 |
| 2017/0372115 A1* | 12/2017 | Lee | G06K 9/00006 |
| 2017/0372123 A1* | 12/2017 | Kim | G06F 3/0412 |
| 2018/0052554 A1 | 2/2018 | Zhang | |
| 2019/0156098 A1* | 5/2019 | Demetriou | G06K 9/00006 |

FOREIGN PATENT DOCUMENTS

| | | | | |
|---|---|---|---|---|
| CN | 204576536 U | 8/2015 | | |
| CN | 204595874 U | 8/2015 | | |
| CN | 105528104 A | 4/2016 | | |
| CN | 106339125 A | 1/2017 | | |
| CN | 206178735 U | 5/2017 | | |
| EP | 1073113 A2 | 1/2001 | | |
| WO | WO-2018038288 A1 * | 3/2018 | | H04M 1/02 |

* cited by examiner

INPUT ASSEMBLY WITH FINGERPRINT IDENTIFICATION CHIP ARRANGED BETWEEN A TOUCH PANEL AND FLEXIBLE CIRCUIT BOARD

CROSS REFERENCE TO RELATED APPLICATIONS

This application claims the priorities of Chinese Application No. 201610678008.2 filed Aug. 16, 2016 and Chinese Application No. 201620891031.5 filed Aug. 16, 2016. The entire disclosures of the above applications are incorporated herein by reference.

BACKGROUND

Field

The present disclosure relates to a fingerprint identification technology field, and more particularly to an input assembly, a terminal, and a manufacturing method.

Background

Some existing mobile phones include a fingerprint identification module and a touch panel. The fingerprint identification module includes a fingerprint identification chip and a packaging component that covers and encapsulates the fingerprint identification chip. A through hole is defined in the touch panel. The fingerprint identification module is disposed below the touch panel and exposed through the through hole to be operated by fingers. However, exposing the fingerprint identification module through the through hole has poor waterproofing and affects the appearance of a mobile phone. In addition, disposing the fingerprint identification module below the touch panel will result in poor identification of fingerprints.

BRIEF DESCRIPTION OF THE DRAWINGS

Advantages of the present disclosure will be apparent and understood easily from the description in conjunction with embodiments of the following drawings.

DETAILED DESCRIPTION OF ILLUSTRATED EMBODIMENTS

Hereinafter, exemplary embodiments of the present disclosure will be described with reference to the accompanying drawings. The same or similar elements or the elements with the same or similar functions will be designated by the same or similar reference numerals throughout the following description and drawings. The following embodiments described with the accompanying drawings are merely exemplary to explain the present disclosure and not to be construed as limiting the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein is required to have specific orientations or be constructed or operates in the specific orientations. Accordingly, the terms should not be construed as limiting the present disclosure. Furthermore, the terms "first" and "second" are for descriptive purposes only and should not be construed as indicating or implying relative importance or implying the number of technical features. As such, features defined by the term "first" and "second" may include one or more of the features explicitly or implicitly. In the description of the present disclosure, the term "more" refers two or more than two, unless otherwise specifically defined.

In the description of the present disclosure, it should be noted that unless otherwise clearly defined and limited, the terms "mounted", "connected/coupled", and "connection" should be interoperated broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

Figure 1:
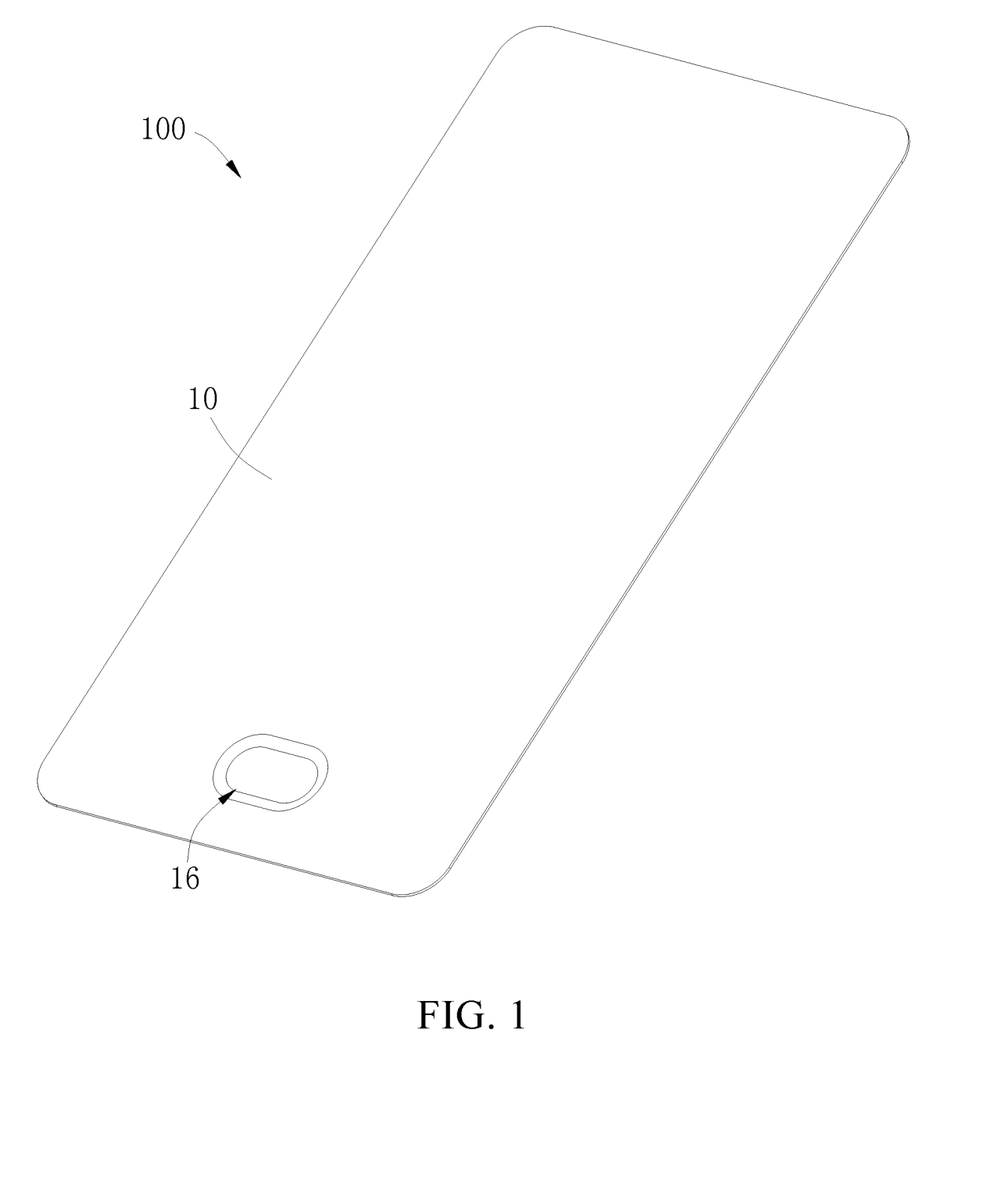
FIG. 1 illustrates a three-dimensional view of an input assembly in accordance with an embodiment of the present disclosure.
Figure 2:
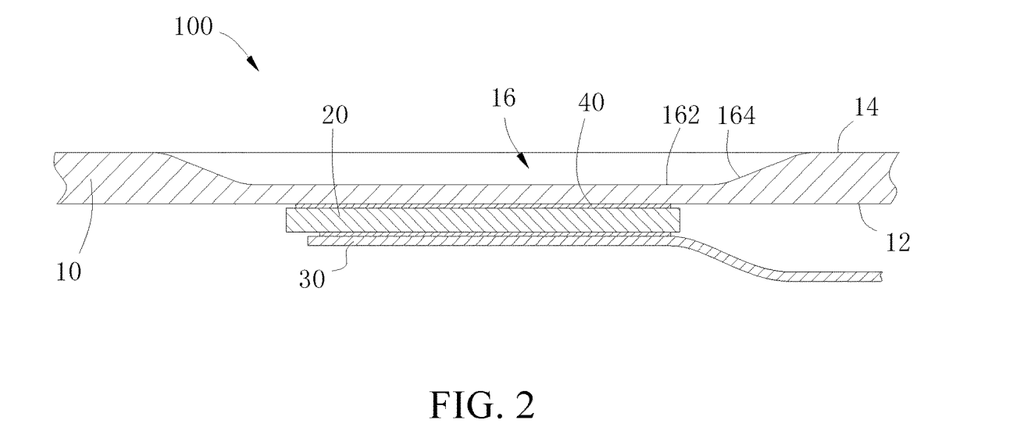
FIG. 2 illustrates a cross-sectional view of the input assembly in accordance with the embodiment of the present disclosure.

Please refer to FIG. 1 and FIG. 2. An input assembly 100 in accordance with an embodiment of the present disclosure includes a touch panel 10, a fingerprint identification chip 20, and a flexible circuit board 30. The fingerprint identification chip 20 is attached to a lower surface of the touch panel 10. The flexible circuit board 30 is attached to the fingerprint identification chip 20. The touch panel 10 and the flexible circuit board 30 are correspondingly disposed on two opposite sides of the fingerprint identification chip 20. In detail, the touch panel 10 is disposed on one side of the fingerprint identification chip 20, the flexible circuit board 30 is disposed on the other side of the fingerprint identification chip 20, and the above-mentioned two sides are opposite to each other.

In the input assembly 100 in accordance with the embodiment of the present disclosure, the fingerprint identification chip 20 is directly attached to a lower surface 12 of the touch panel 10. Accordingly, the fingerprint identification chip 20 can have better waterproofing, and a distance between the fingerprint identification chip 20 and a finger can be reduced, so as to improve the accuracy of fingerprint identification.

Furthermore, the flexible circuit board 30 is directly attached to the fingerprint identification chip 20. Accordingly, the thickness of the input assembly 100 can be reduced, and therefore, a simpler structure can be achieved. It can be understood that the flexible circuit board 30 is electrically connected to the fingerprint identification chip 20.

The input assembly 100 in accordance with the embodiment of the present disclosure may be applied to a terminal. For example, the terminal may be a mobile phone, a tablet computer, or other electronic devices. It can be understood that the terminal is not limited to the examples of the present embodiment.

As such, a user can lock the terminal via a fingerprint. When the user uses the terminal, fingerprint identification can be conducted via the input assembly 100 to unlock the terminal. The shape of the touch panel 10 may be designed according to shape of the terminal, for example, the touch panel 10 can be designed to be a rounded rectangle.

When the user tries to unlock the terminal via fingerprint identification, the user may put a finger, on the upper surface 14, at a position corresponding to the fingerprint identification chip 20, The upper surface 14 is opposite to the lower surface 12. Signals of the fingerprint identification chip 20 can be configured to collect and identify a fingerprint pattern of the user via the touch panel 10. The fingerprint pattern of the user is compared with a fingerprint pattern stored in advance. The terminal can be unlocked when the fingerprint image matches.

It can be understood that a sensing pixel array may be disposed on a surface of the fingerprint identification chip 20 that near the lower surface 12 of the touch panel 10 to collect the fingerprint pattern of the user.

In order that the user can accurately place his or her finger at a position corresponding to the fingerprint identification chip 20, a mark may be provided on a position of the touch panel 10 corresponding to the fingerprint identification chip 20. For example, a screen printing process can be used to provide the mark. The mark may be provided on the lower surface 12 of the touch panel 10 or the upper surface 14 of the touch panel 10.

For example, the touch panel 10 may be made of glass, ceramic, sapphire, and other materials. The touch panel 10 serves as an input element of the terminal, and thus the touch panel 10 is often subject to a collision or a scratch. For example, when the user puts the terminal in a pocket, the touch panel 10 may be scratched and damaged by keys in the pocket.

Accordingly, the touch panel 10 may be made of harder material, such as the above-mentioned sapphire.

Usually, the middle area of the touch panel 10 can be divided into a display area and a non-display area. In the display area, the user can view contents displayed on a screen of the terminal. The non-display area may be situated at two ends of the touch panel 10 in a longitudinal direction, for example, the non-display area may be situated at the top and the bottom of the touch panel 10.

The fingerprint identification chip 20 may be attached to the bottom of the lower surface 12. As such, a larger space for design can be provided for the fingerprint identification chip 20.

Further, the fingerprint identification chip 20 is attached to the middle of the lower surface 12 for the user to operate conveniently. In addition, when the mark is provided on the touch panel 10, the mark may be situated in the middle of the touch panel 10 to make the terminal more attractive.

In some embodiments, a first groove 16 is formed on the upper surface 14 of the touch panel 10 opposite to the lower surface 12. In detail, the first groove 16 is formed on the surface of the touch panel 10 that is far away from the fingerprint identification chip 20, and aligned with the fingerprint identification chip 20 in the vertical direction. The position of the fingerprint identification chip 20 corresponds to that of the first groove 16. For example, the first groove 16 may be formed by a cutting or an etching process.

Accordingly, in one aspect, it is helpful to reduce the distance between the fingerprint identification chip 20 and the upper surface 14. It is also helpful to identify the fingerprint pattern of the finger by the signals of the fingerprint identification chip 20 via the touch panel 10, thereby ensuring sensitivity of the fingerprint identification chip 20.

In addition, the first groove 16 is formed on a part of the touch panel 10 which covers the fingerprint identification chip 20. Structural strength of remaining parts (parts other the part on which the first groove 16 is formed) of the touch panel 10 can be maintained, and the distance between the fingerprint identification chip 20 and the upper surface 14 can be reduced.

In another aspect, the first groove 16 can locate the position corresponding to the fingerprint identification chip 20 accurately to facilitate the fingerprint identification. In detail, the fingerprint identification chip 20 is aligned with the first groove 16.

It is noted that as an embodiment illustrated in FIG. 1, the first groove 16 has an oval shape. As such, an appearance of the input assembly 10 is more attractive. In other embodiments, the first groove 16 may has any other shape, for example, a rectangular shape. Accordingly, the first groove 16 of the present disclosure is not limited to the illustrated embodiment of the present disclosure.

In detail, the first groove 16 is defined by a bottom surface 162 and an inclined guiding surface 164. The bottom surface 162 is substantially parallel to the upper surface 14. The inclined guiding surface 164 connects the bottom surface 162 and the upper surface 14.

As such, the inclined guiding surface 164 can guide the finger of the user to the first groove 16 to perform fingerprint identification.

It can be understood that the inclined guiding surface 164 may have an annular surface. Accordingly, it is convenient for the user to place his or her finger in the first groove 16 from any direction to press the bottom surface 162 of the first groove 16, thereby performing fingerprint identification.

Further, the inclined guiding surface 164 is inclined from the bottom surface 162 to the upper surface 14, so that the first groove 16 is larger in top and smaller in bottom. That is, the cross-sectional area of the first groove 16 increases from the bottom surface 162 to the upper surface 14.

In some embodiments, a joint between the inclined guiding surface 164 and the upper surface 14 may have a circular arc.

As such, when the user places his or her finger in the first groove 16, the joint between the inclined guiding surface 164 and the upper surface 14 can decrease pressure on the finger, thereby improving user experience.

In some embodiments, an orthographic projection of the fingerprint identification chip 20 falls onto the bottom surface 162.

As such, when the finger of the user presses the bottom surface 162, the fingerprint identification chip 20 can collect the fingerprint pattern of the finger to identify the fingerprint pattern.

In some embodiments, the orthographic projection of the fingerprint identification chip 20 falling onto the bottom surface 162 fits the shape and size of the bottom surface 162. In detail, the shape of the orthographic projection of the fingerprint identification chip 20 falling onto the bottom surface 162 is substantially the same as or similar to the shape of the bottom surface 162, and the size of the orthographic projection of the fingerprint identification chip 20 falling onto the bottom surface 162 is slightly smaller than the size of the bottom surface 162.

For example, the orthographic projection of the fingerprint identification chip 20 falling onto the bottom surface 162 is rectangular. Accordingly, the bottom surface 162 may be rectangular or oval. The size of the bottom surface 162 is slightly larger than the size of the orthographic projection of the fingerprint identification chip 20 falling onto the bottom surface 162.

As such, it is helpful to identify the fingerprint pattern of the finger pressing the bottom surface 162 by the fingerprint identification chip 20.

Figure 3:
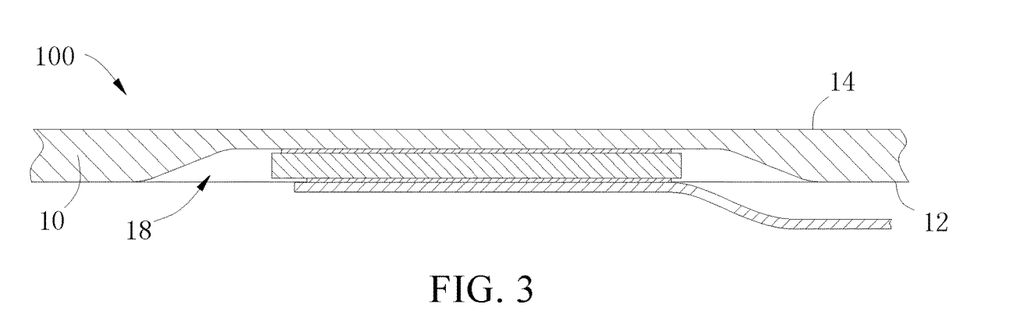
FIG. 3 illustrates another cross-sectional view of the input assembly in accordance with an embodiment of the present disclosure.

In conjunction with FIG. 3, in some embodiments, a second groove 18 is formed on the lower surface 12. The fingerprint identification chip 20 is disposed (accommodated) in the second groove 18. In detail, the second groove 18 is formed on a surface of the touch panel 10 that is in contact with the fingerprint identification chip 20. For example, the second groove 18 may be formed by a cutting or an etching process.

Accordingly, it is helpful to reduce the distance between the fingerprint identification chip 20 and the upper surface 14. It is also helpful to identify the fingerprint pattern of the finger by the signals of the fingerprint identification chip 20 via the touch panel 10, thereby ensuring sensitivity of the fingerprint identification chip 20.

In addition, the second groove 18 is formed on a part on which the fingerprint identification chip 20 is disposed. Structural strength of remaining parts (parts other the part on which the first groove 16 is formed) of the touch panel 10 can be maintained, and the distance between the fingerprint identification chip 20 and the upper surface 14 can be reduced.

In some embodiments, the shape and size of the second groove 18 fit the shape and size of the fingerprint identification chip 20. For example, the fingerprint identification chip 20 is rectangular. Accordingly, the second groove 18 is oval. In detail, the shape of the second groove 18 is substantially the same as or similar to the shape of the fingerprint identification chip 20, and the size of the second groove 18 is approximately larger than the size of the fingerprint identification chip 20.

As such, it is helpful to assemble the fingerprint identification chip 20 to the second groove 18, and the structure of the input assembly 100 may be more compact.

Figure 4:
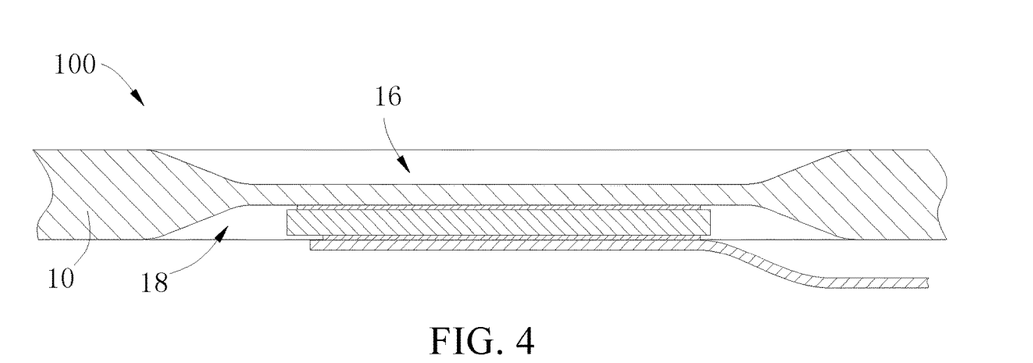
FIG. 4 illustrates yet another cross-sectional view of the input assembly in accordance with an embodiment of the present disclosure.

In conjunction with FIG. 4, in some embodiments, the shape and the position of the second groove 18 fit that of the first groove 16 respectively. In detail, the second groove 18 is aligned with the first groove 16. The shape of the second groove 18 is substantially the same as or similar to the shape of the first groove 16, and the size of the second groove 18 is approximately equal to or similar to the size of the first groove 16.

In detail, when the first groove 16 and the second groove 18 are both formed on the touch panel 10, the fingerprint identification chip 20 is disposed in the second groove 18. The position of the first groove 16 corresponds to the position of the second groove 18, so that the thickness of the touch panel 10 covering the fingerprint identification chip 20 can be reduced.

The shape of the first groove 16 is similar to or the same as the shape of the second groove 18. As mentioned above, both the first groove 16 and the second groove 18 are oval.

In some embodiments, a part of the touch panel 10 that covers the fingerprint identification chip 20 has a thickness less than 0.3 millimeters (mm).

Generally, the signals of the fingerprint identification chip 20 can pass through the touch panel 10 having a thickness of 0.3 mm. Accordingly, it is helpful to identify information of the fingerprint pattern of the finger by the fingerprint identification chip 20 when the part of the touch panel 10 that covers the fingerprint identification chip 20 has the thickness less than 0.3 mm.

As mentioned in the above embodiments, it is possible to make the thickness of the part of the touch panel 10 that covers the fingerprint identification chip 20 to be less than 0.3 mm by forming the first groove 16 and/or the second groove 18.

Furthermore, it is possible to make the thickness of the part of the touch panel 10 that covers the fingerprint identification chip 20 to be less than 0.3 mm by thinning the non-display area of the touch panel 10.

Please refer to FIG. 2, in some embodiments, the input assembly 100 includes an adhesive 40. The adhesive 40 is configured to adhere the fingerprint identification chip 20 and the touch panel 10.

As such, the fingerprint identification chip 20 can be firmly attached to the lower surface 12 of the touch panel 10 via the adhesive 40, and the adhesive 40 has less influence on the signals of the fingerprint identification chip 20. For example, the adhesive 40 may be a hot melt adhesive. When the fingerprint identification chip 20 is assembled, the adhesive 40 is heated so that the adhesive 40 can be in a liquid state. Thereafter, the adhesive 40 is applied to the fingerprint identification chip 20. Finally, the fingerprint identification chip 20 with the adhesive 40 is adhered to the lower surface 12 of the touch panel 10.

It can be understood that the flexible circuit board 30 may be attached to the fingerprint identification chip 20 via the adhesive 40 as well.

Figure 5:
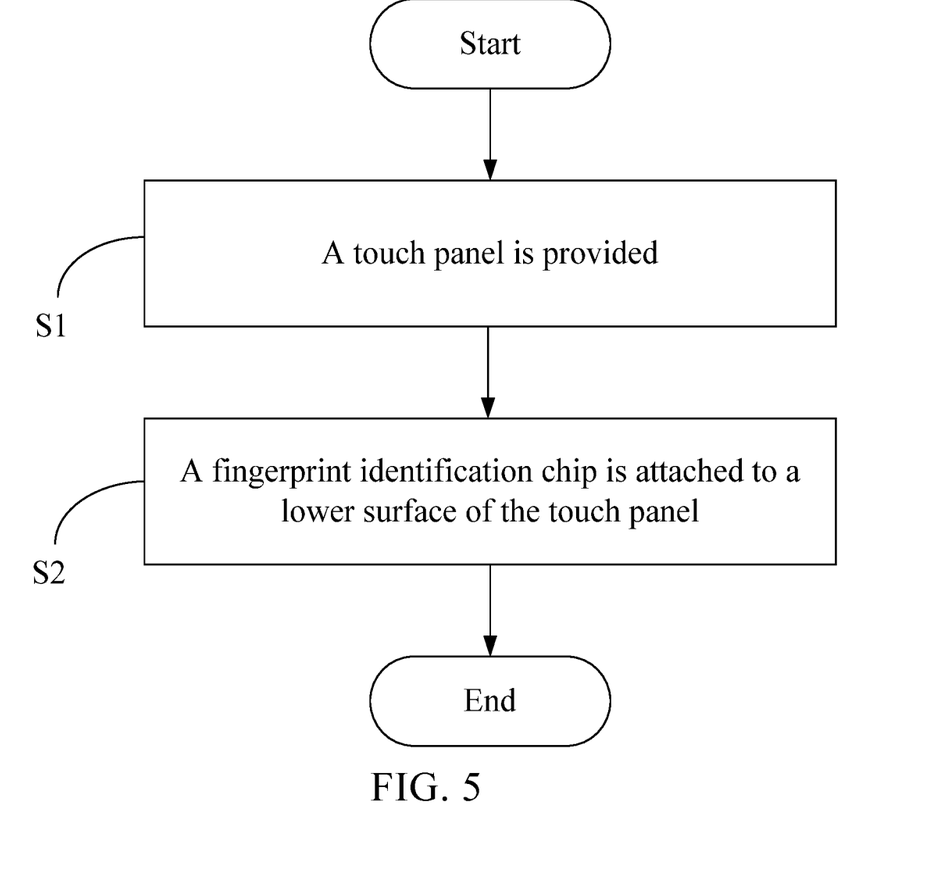
FIG. 5 illustrates a flowchart of a manufacturing method in accordance with an embodiment of the present disclosure.

Please refer to FIG. 5, which illustrates a manufacturing method for manufacturing an input assembly in accordance with an embodiment of the present disclosure. The manufacturing method includes the following operations.

At block S1, a touch panel is provided.

At block S2, a fingerprint identification chip is attached to a lower surface of the touch panel.

In the manufacturing method in accordance with the embodiment of the present disclosure, the fingerprint identification chip is directly attached to the lower surface of the touch panel. Accordingly, the fingerprint identification chip can have better waterproofing, and a distance between the fingerprint identification chip and a fingerprint can be decreased, so as to improve the accuracy of fingerprint identification.

The manufacturing method in accordance with the embodiment of the present disclosure may be utilized to manufacture the input assemblies 100 of the above-mentioned embodiments.

In some embodiments, the block S2 includes the following operation.

A first groove is formed on an upper surface of the touch panel opposite to the lower surface, and the fingerprint identification chip is attached to the lower surface of the touch panel at a position corresponding to the first groove.

As such, it is helpful to reduce the distance between the fingerprint identification chip and the upper surface. It is also helpful to identify a fingerprint pattern of the finger by signals of the fingerprint identification chip via the touch panel, thereby ensuring sensitivity of the fingerprint identification chip.

In some embodiments, the block S2 includes the following operation.

The fingerprint identification chip is disposed in a second groove formed on the lower surface.

Figure 6:
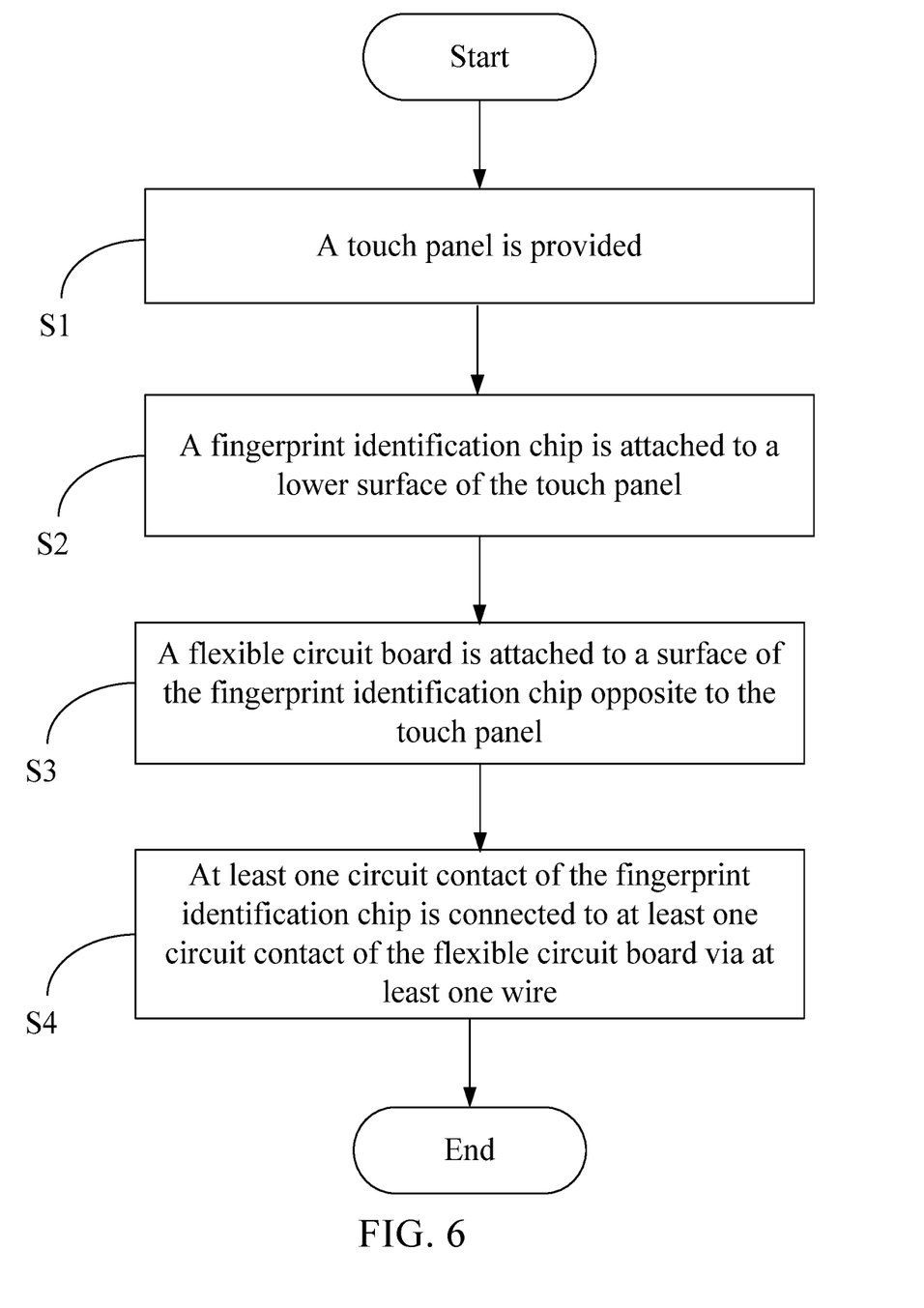
FIG. 6 illustrates another flowchart of a manufacturing method in accordance with an embodiment of the present disclosure.

Please refer to FIG. 6. In some embodiments, the manufacturing method further includes the following operations.

At block S3, a flexible circuit board is attached to a surface of the fingerprint identification chip opposite to the touch panel.

At block S4, at least one circuit contact of the fingerprint identification chip is connected to at least one circuit contact of the flexible circuit board via at least one wire.

As such, the signals of the fingerprint identification chip may be transmitted to a processor via the flexible circuit board for processing.

Figure 7:
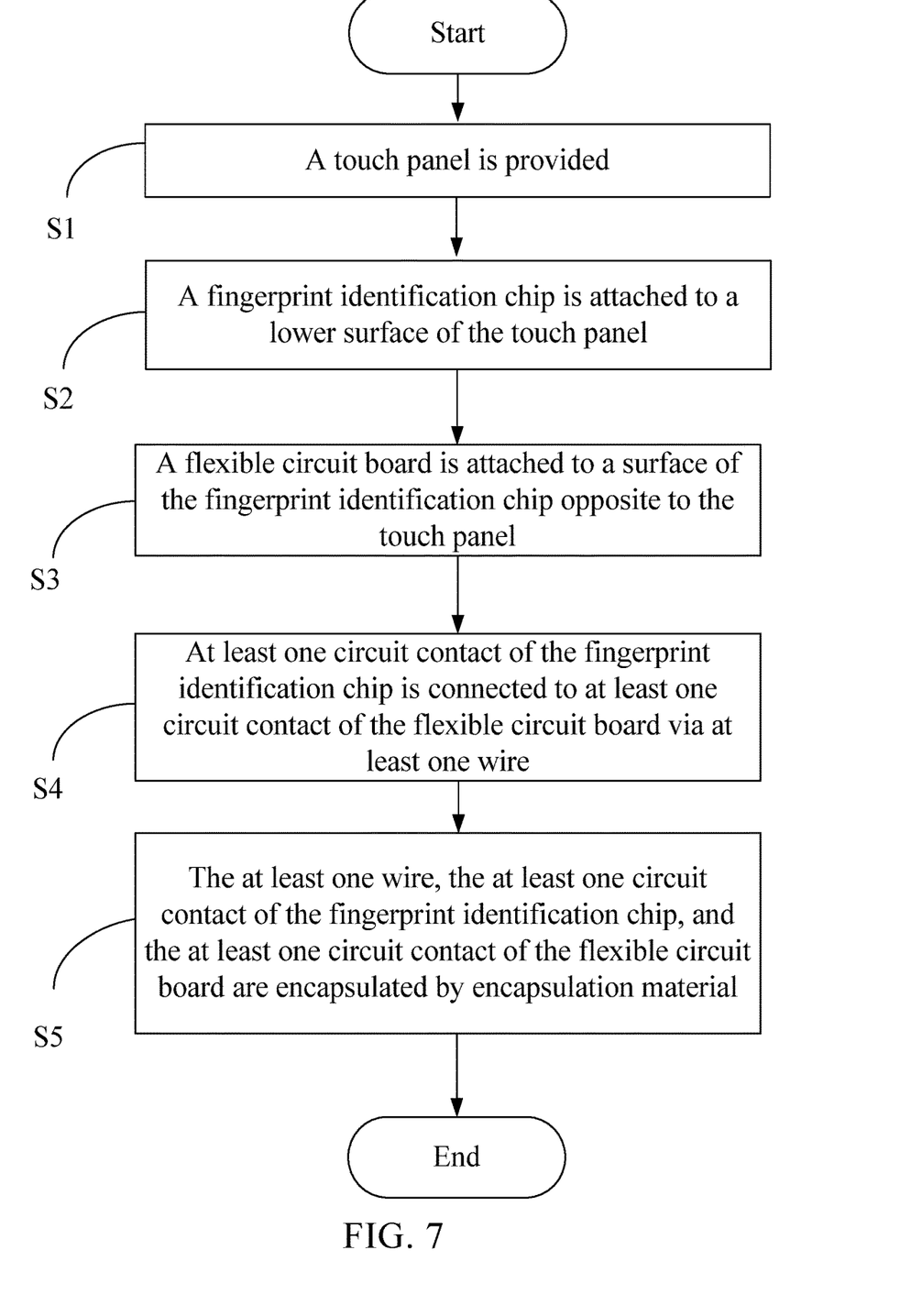
FIG. 7 illustrates yet another flowchart of a manufacturing method in accordance with an embodiment of the present disclosure.

Please refer to FIG. 7. In some embodiments, the manufacturing method includes the following operations.

At block S5, the at least one wire, the at least one circuit contact of the fingerprint identification chip, and the at least one circuit contact of the flexible circuit board are encapsulated by encapsulation material.

As such, the input assembly is attractive, and a poor contact due to an open circuit between the fingerprint identification chip and the flexible circuit board may be prevented.

It is noted that the explained description of the input assemblies 100 in accordance with the embodiments of the present disclosure is suitable for the manufacturing methods in accordance with the embodiments of the present disclosure. Accordingly, other parts which are not described can be referred to the above-mentioned description of the input assemblies 100 in accordance with the embodiments and are not repeated herein.

In the description of the specification, reference terminologies "an embodiment", "some embodiments", "an illustrate embodiment", "an example", "a specific example", or "some examples", "some embodiments", "some embodiments", "some embodiments", or "some embodiments" mean that specific features, structures, materials, or characteristics in conjunction with the description of the embodiments or examples are included in at least one of the embodiments or examples. In the specification, the illustrated description of the above-mentioned terminologies is not limited to the same embodiment or example. Moreover, the described specific features, structures, materials, or characteristics may be combined in a proper way in any one or more of the embodiments or examples. For example, the adhesive 40 in FIG. 2 may be used in the assemblies 100 in FIG. 3 and FIG. 4. Alternatively, the shape of the second groove 18 in FIG. 3 and FIG. 4 may be the same the shape of the first groove 16 defined by the bottom surface 162 and the inclined guiding surface 164.

While the embodiments of the present disclosure have been shown and described, it will be understood by those skilled in the art that various changes, modifications, equivalents, and variants may be made without departing from the spirit and scope of the present disclosure. Therefore, the scope of the present disclosure should be defined by the appended claims and equivalents of the appended claims.

What is claimed is:

1. An input assembly, comprising:
   a touch panel having a lower surface and an upper surface opposite to the lower surface, the touch panel defining a first groove on the upper surface and a second groove on the lower surface; wherein
      the first groove is defined by a bottom surface and an inclined guiding surface, the bottom surface is substantially parallel to the upper surface, and the inclined guiding surface connects the bottom surface and the upper surface; and
      a joint between the inclined guiding surface and the upper surface has a circular arc shape;
   a fingerprint identification chip;
   a first adhesive being attached to a top surface of the fingerprint identification chip and a second adhesive being attached to a bottom surface of the fingerprint identification, the first adhesive and the second adhesive being the same adhesives, the first adhesive and the second adhesive being hot melt adhesives and having less influence on signals of the fingerprint identification chip, and the fingerprint identification chip being disposed in the second groove via the first adhesive;
   a flexible circuit board attached to the fingerprint identification chip via the second adhesive;
   a mark is provided on a position of the touch panel corresponding to the fingerprint identification chip by a screen printing process;
   the touch panel and the flexible circuit board being correspondingly disposed on two opposite sides of the fingerprint identification chip; and
   the first groove and the second groove are symmetrical to each other.

2. The input assembly of claim 1, wherein the inclined guiding surface has an annular surface.

3. The input assembly of claim 1, wherein a part of the touch panel that covers the fingerprint identification chip has a thickness less than 0.3 millimeters and greater than zero.

4. A terminal, comprising an input assembly, wherein the input assembly comprises:
   a touch panel having a lower surface and an upper surface opposite to the lower surface, the touch panel defining a first groove on the upper surface and a second groove on the lower surface; wherein the first groove is defined by a bottom surface and an inclined guiding surface, the bottom surface is substantially parallel to the upper surface, and the inclined guiding surface connects the bottom surface and the upper surface; and a joint between the inclined guiding surface and the upper surface has a circular arc shape;

a fingerprint identification chip;

a first adhesive being attached to a top surface of the fingerprint identification chip and a second adhesive being attached to a bottom surface of the fingerprint identification, the first adhesive and the second adhesive being hot melt adhesives and having less influence on signals of the fingerprint identification chip, and the fingerprint identification chip being disposed in the second groove via the first adhesive;

a flexible circuit board attached to the fingerprint identification chip via the second adhesive;

a mark is provided on a position of the touch panel corresponding to the fingerprint identification chip by a screen printing process;

the touch panel and the flexible circuit board being correspondingly disposed on two opposite sides of the fingerprint identification chip; and the first groove and the second groove are symmetrical to each other.

5. The terminal of claim 4, wherein the inclined guiding surface has an annular surface.

6. The terminal of claim 4, wherein a part of the touch panel that covers the fingerprint identification chip has a thickness less than 0.3 millimeters and greater than zero.

* * * * *